(12) United States Patent
Cheng et al.

(10) Patent No.: US 8,399,957 B2
(45) Date of Patent: Mar. 19, 2013

(54) DUAL-DEPTH SELF-ALIGNED ISOLATION STRUCTURE FOR A BACK GATE ELECTRODE

(75) Inventors: Kangguo Cheng, Guilderland, NY (US); Balasubramanian S. Haran, Watervliet, NY (US); Ali Khakifirooz, Slingerlands, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 53 days.

(21) Appl. No.: 13/082,491

(22) Filed: Apr. 8, 2011

(65) Prior Publication Data

US 2012/0256260 A1    Oct. 11, 2012

(51) Int. Cl.
*H01L 29/06* (2006.01)
(52) U.S. Cl. .............. 257/510; 257/E21.421; 257/347
(58) Field of Classification Search .............. 257/347, 257/510–515, E21.421
See application file for complete search history.

(56) References Cited

U.S. PATENT DOCUMENTS

| | | | |
|---|---|---|---|
| 5,733,813 A | 3/1998 | Chen et al. | |
| 5,783,476 A | 7/1998 | Arnold | |
| 6,576,558 B1 | 6/2003 | Lin et al. | |
| 6,590,271 B2 | 7/2003 | Liu et al. | |
| 6,875,697 B2 | 4/2005 | Trivedi | |
| 7,109,348 B1 | 9/2006 | Nolan | |
| 7,635,899 B2 | 12/2009 | Yang et al. | |
| 7,781,302 B2 | 8/2010 | Cha et al. | |
| 7,812,403 B2 * | 10/2010 | Disney et al. | 257/374 |
| 8,030,730 B2 * | 10/2011 | Nitta et al. | 257/501 |
| 8,258,575 B2 * | 9/2012 | Williams et al. | 257/349 |
| 2006/0231873 A1 * | 10/2006 | Anderson et al. | 257/288 |
| 2008/0197448 A1 * | 8/2008 | Hakey et al. | 257/510 |
| 2010/0140701 A1 | 6/2010 | Kim | |
| 2011/0215394 A1 * | 9/2011 | Komori et al. | 257/324 |

* cited by examiner

*Primary Examiner* — Nathan Ha
(74) *Attorney, Agent, or Firm* — Scully, Scott, Murphy & Presser, P.C.; Catherine Ivers, Esq.

(57) ABSTRACT

Doped semiconductor back gate regions self-aligned to active regions are formed by first patterning a top semiconductor layer and a buried insulator layer to form stacks of a buried insulator portion and a semiconductor portion. Oxygen is implanted into an underlying semiconductor layer at an angle so that oxygen-implanted regions are formed in areas that are not shaded by the stack or masking structures thereupon. The oxygen implanted portions are converted into deep trench isolation structures that are self-aligned to sidewalls of the active regions, which are the semiconductor portions in the stacks. Dopant ions are implanted into the portions of the underlying semiconductor layer between the deep trench isolation structures to form doped semiconductor back gate regions. A shallow trench isolation structure is formed on the deep trench isolation structures and between the stacks.

11 Claims, 17 Drawing Sheets

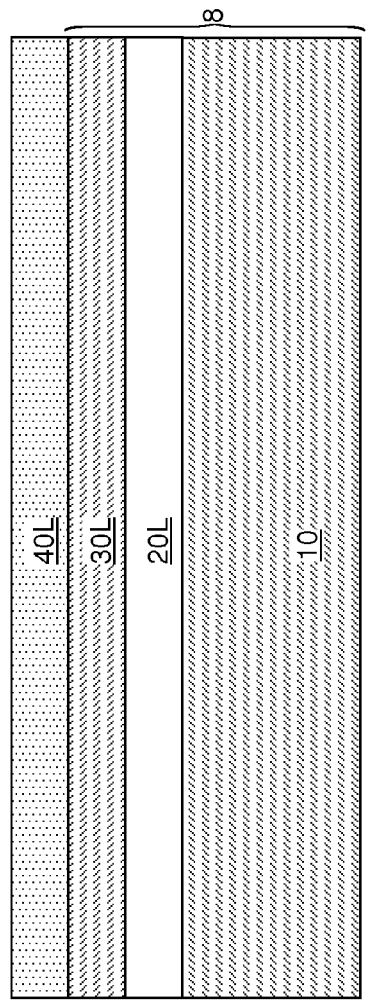
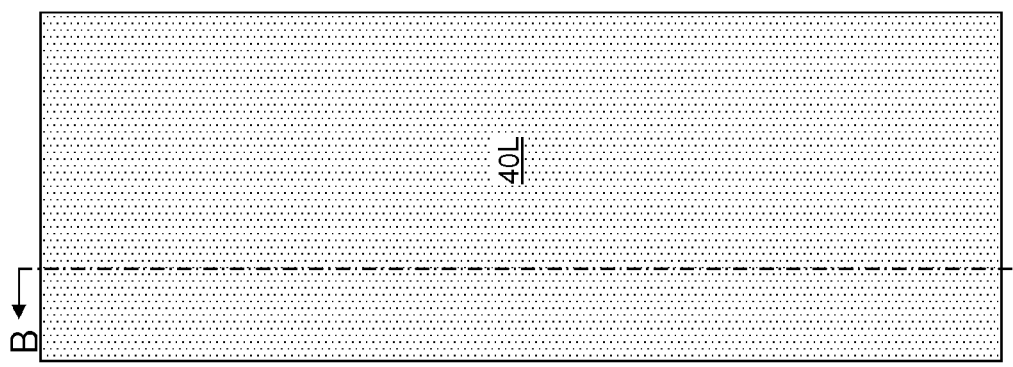
FIG. 1B
FIG. 1A

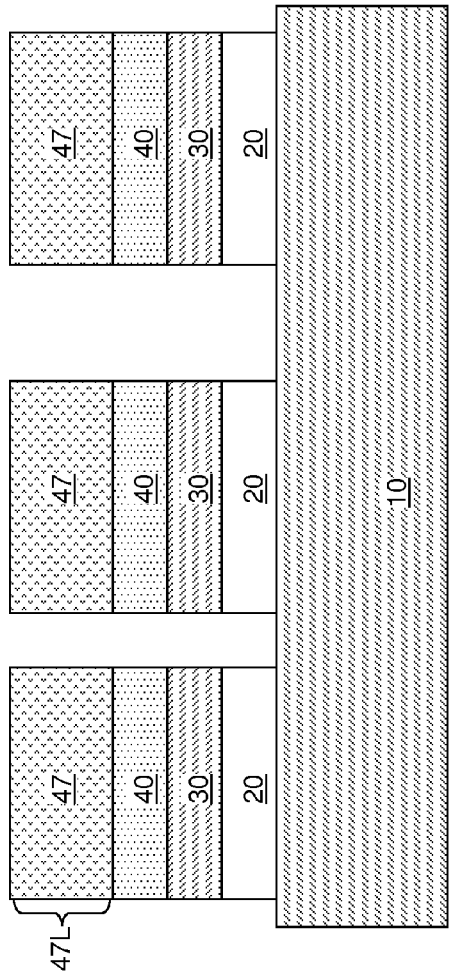
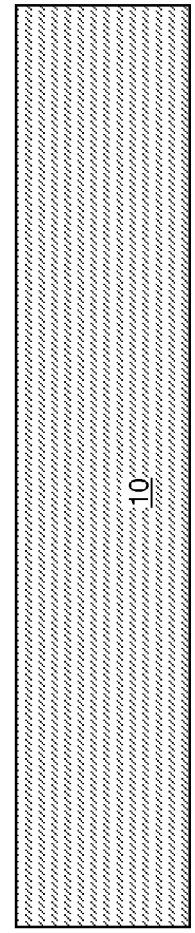
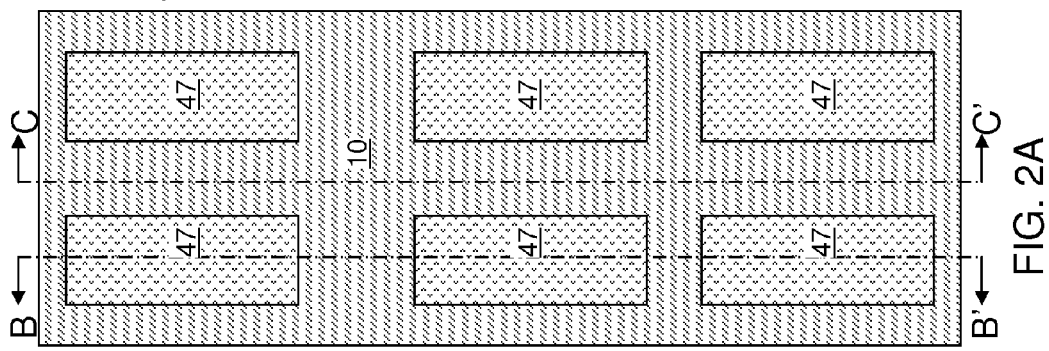
FIG. 2B
FIG. 2C
FIG. 2A

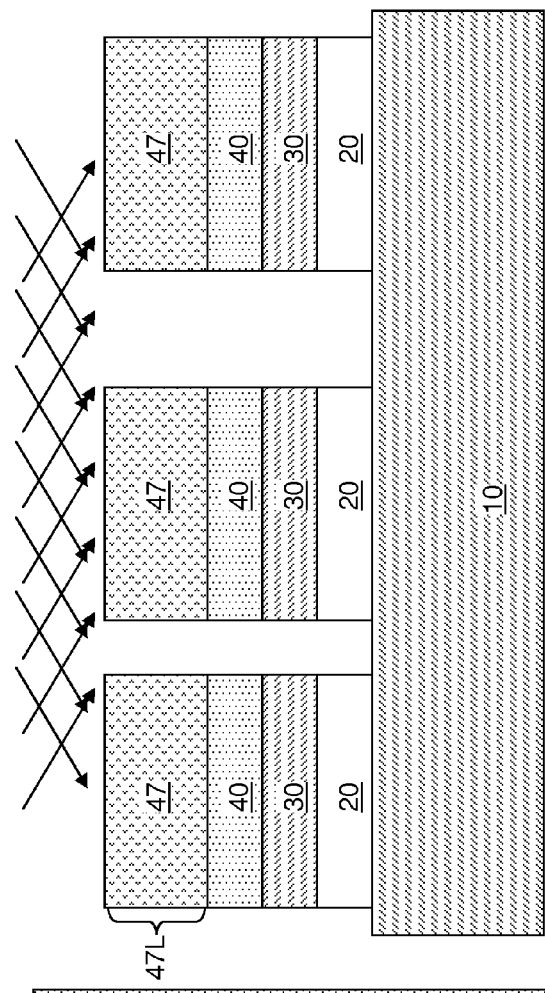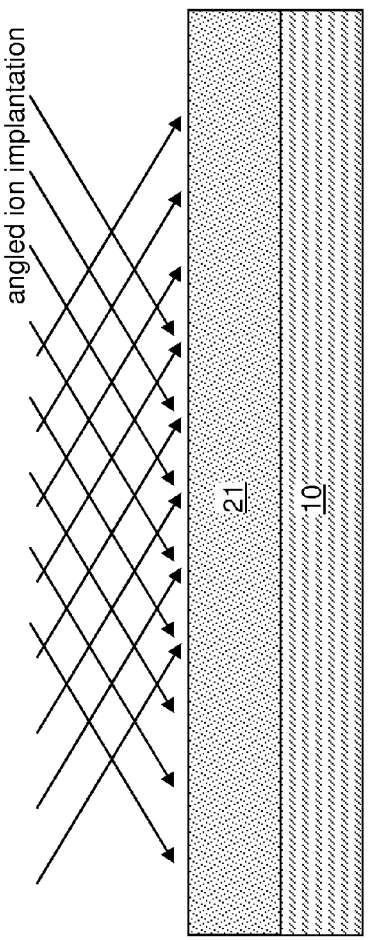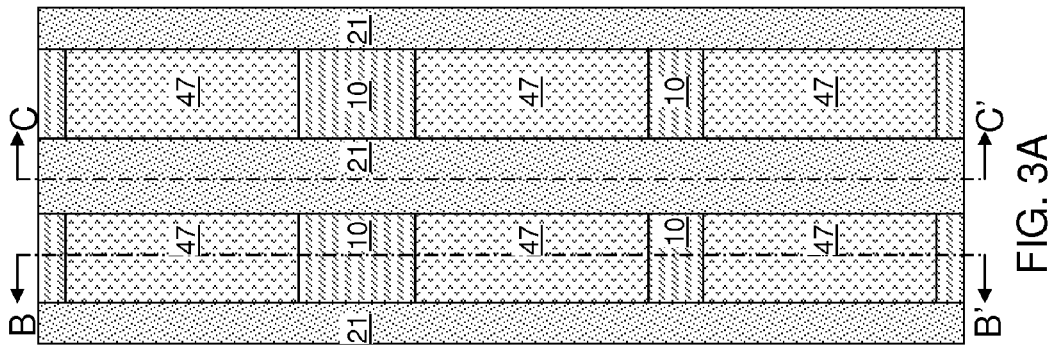

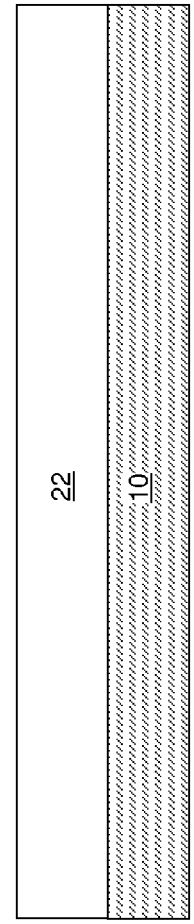
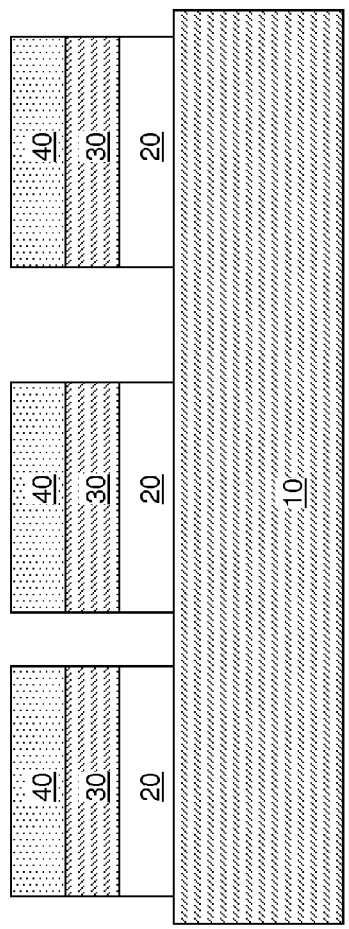
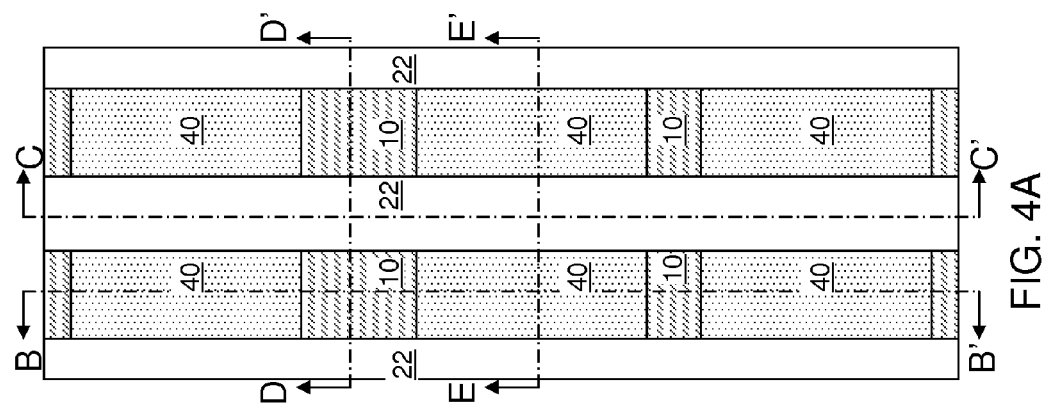
FIG. 4B
FIG. 4C
FIG. 4A

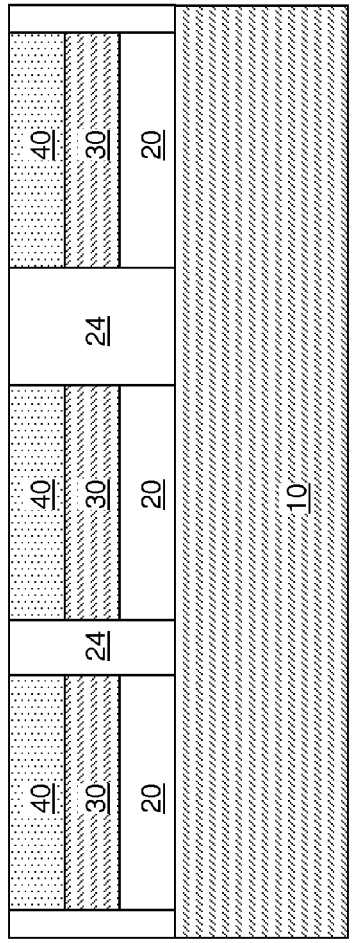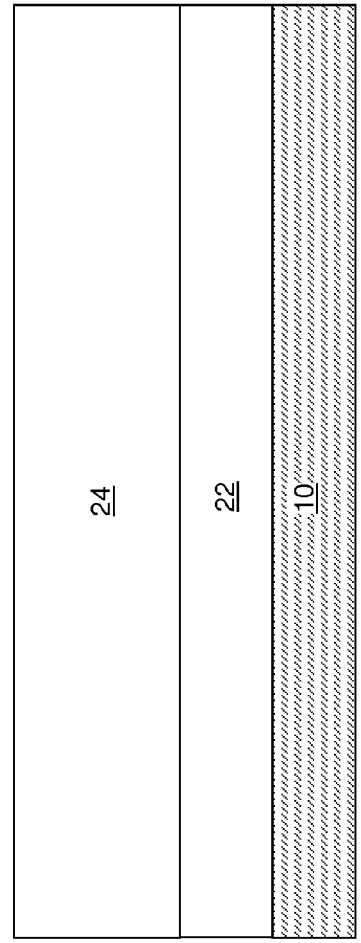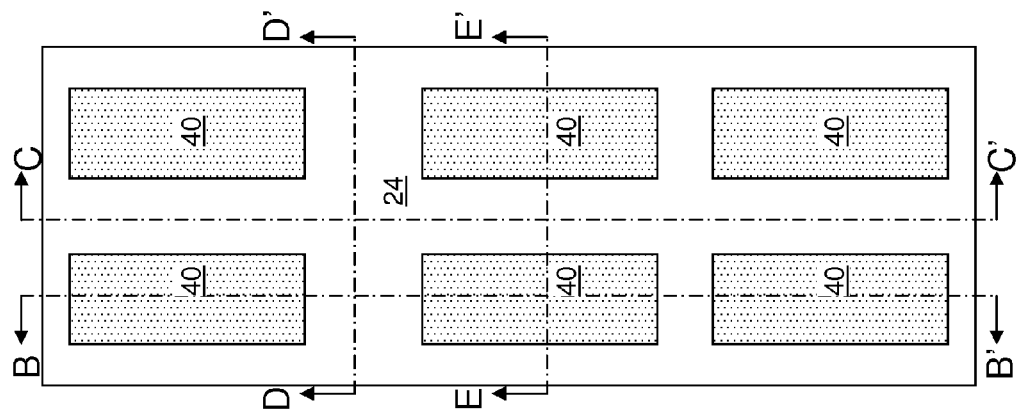

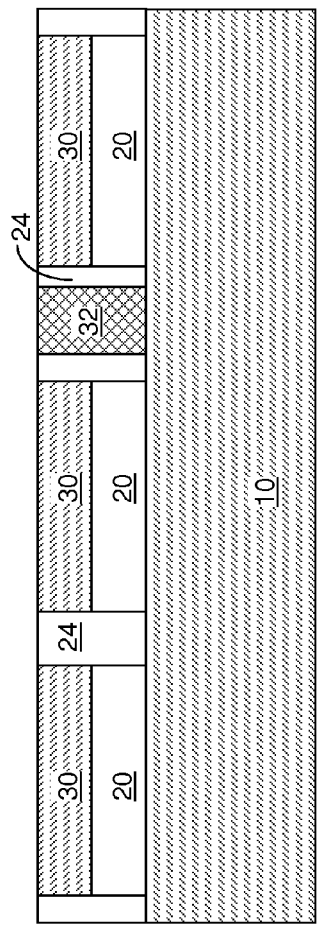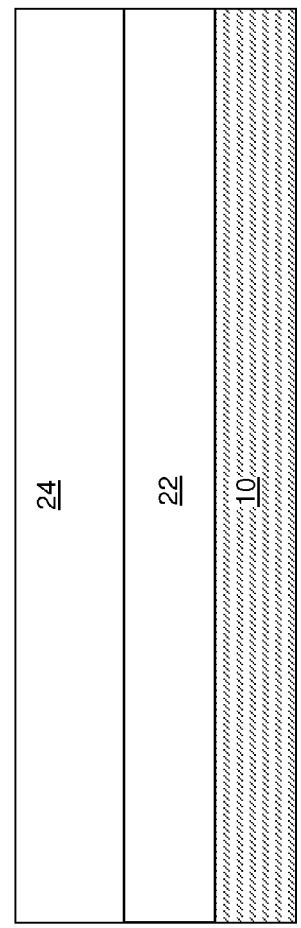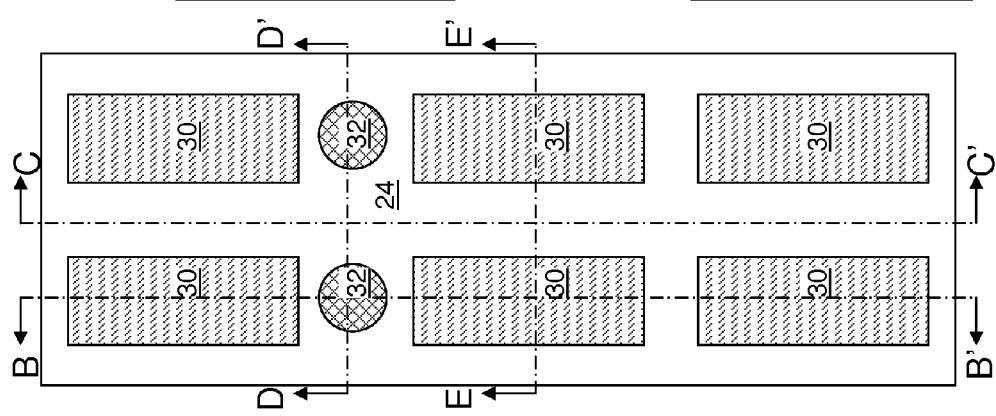

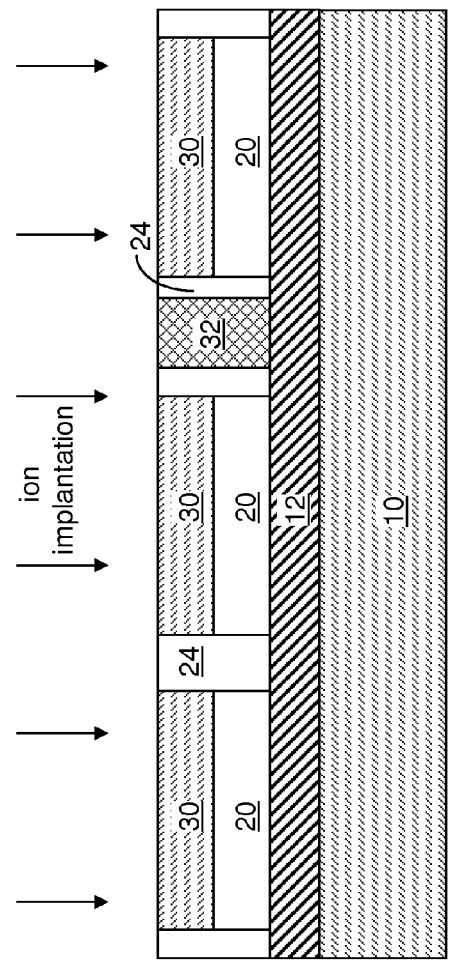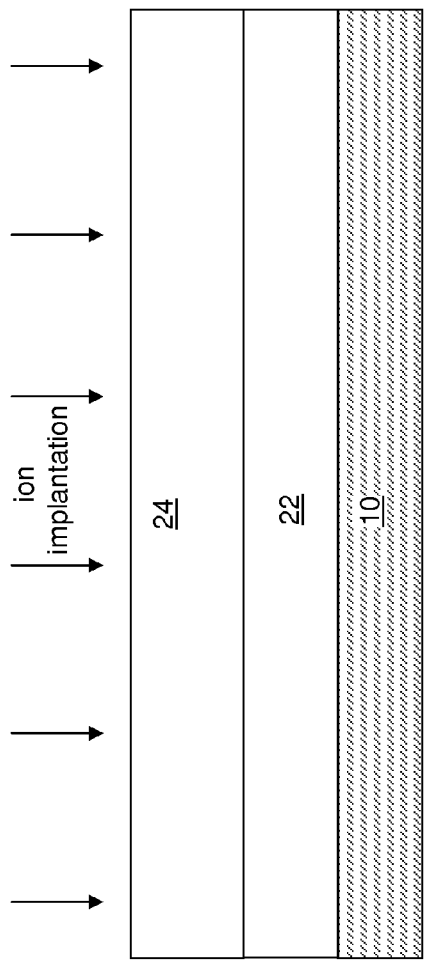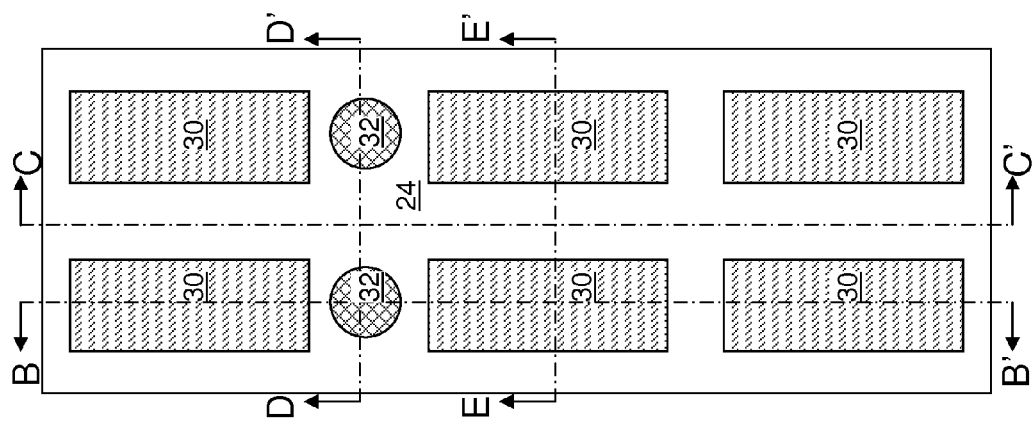

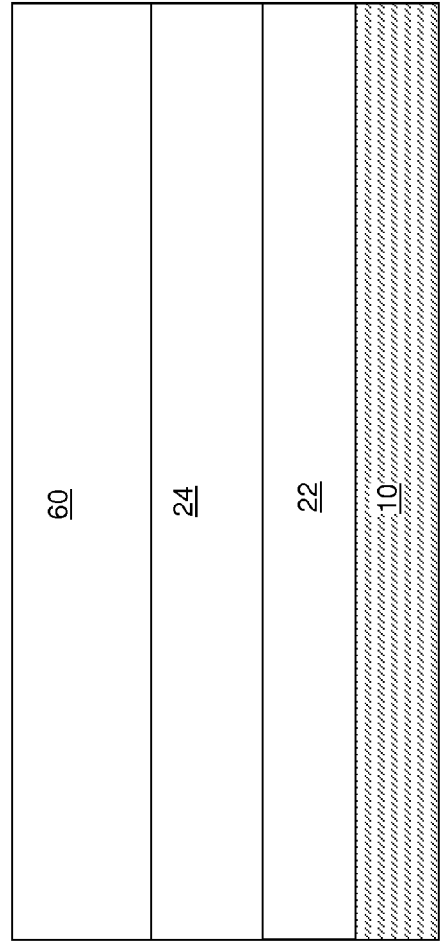
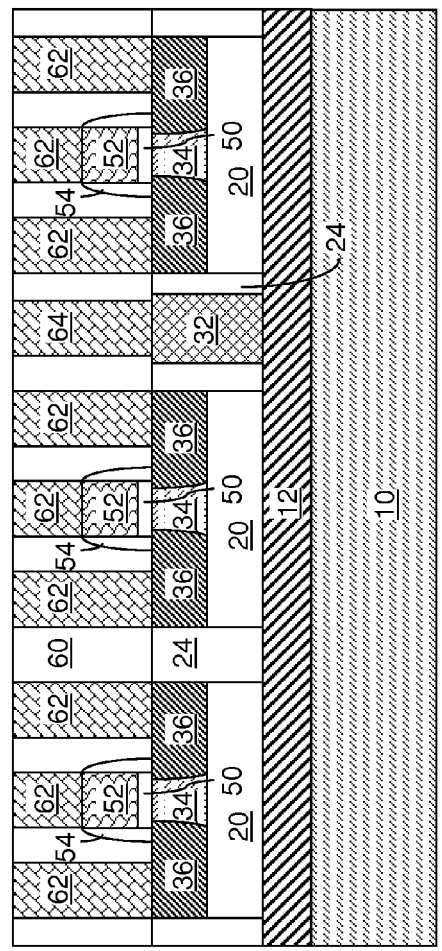
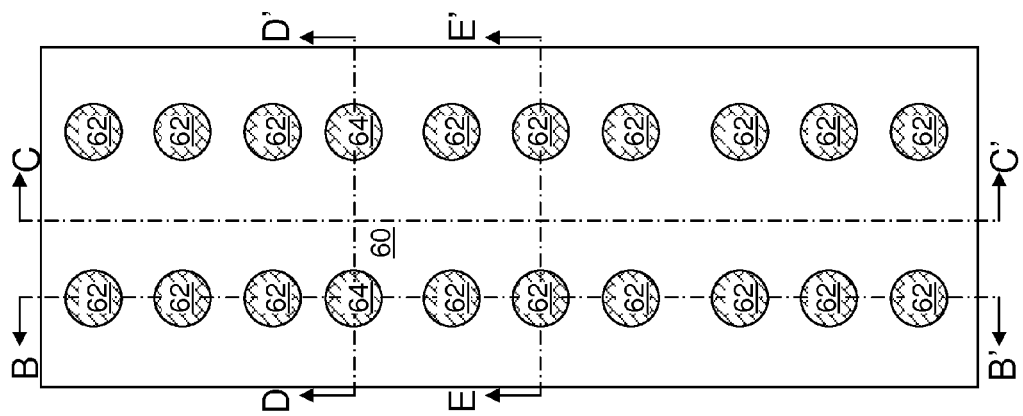

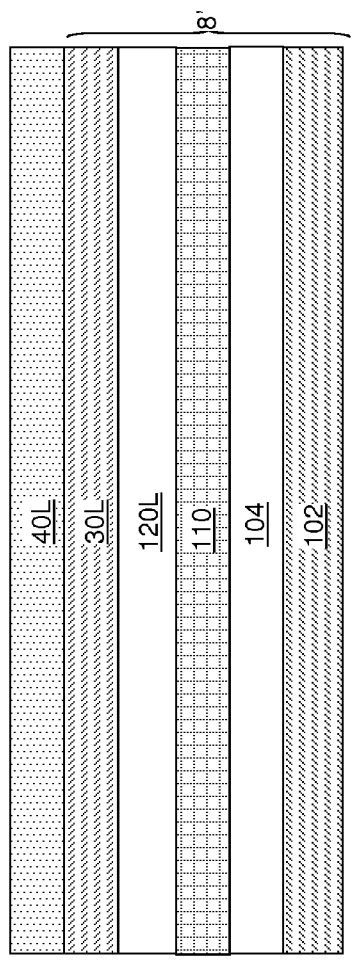
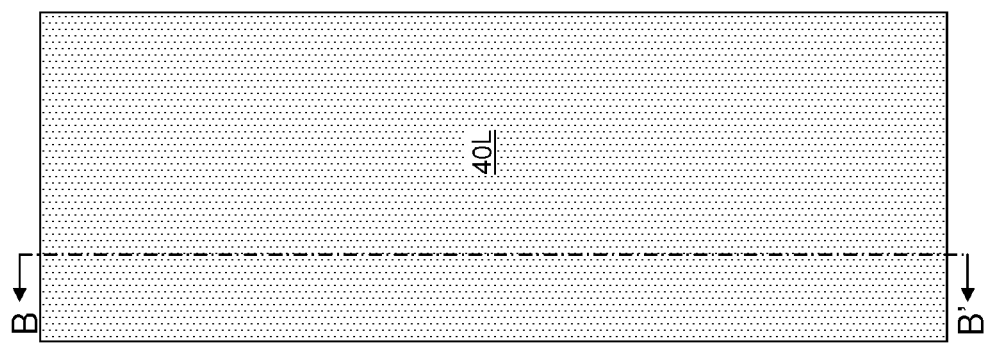
FIG. 9B
FIG. 9A

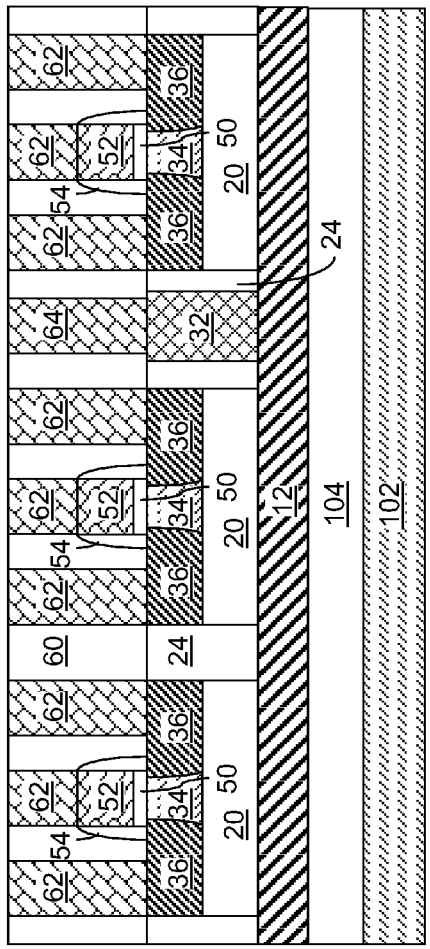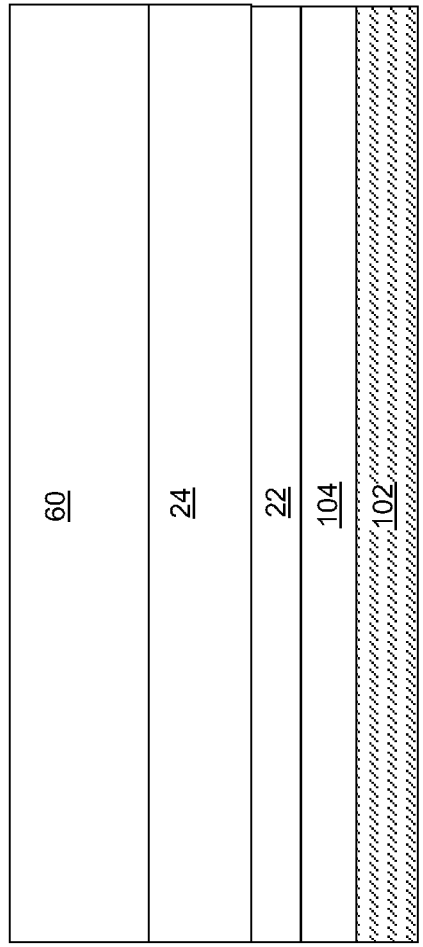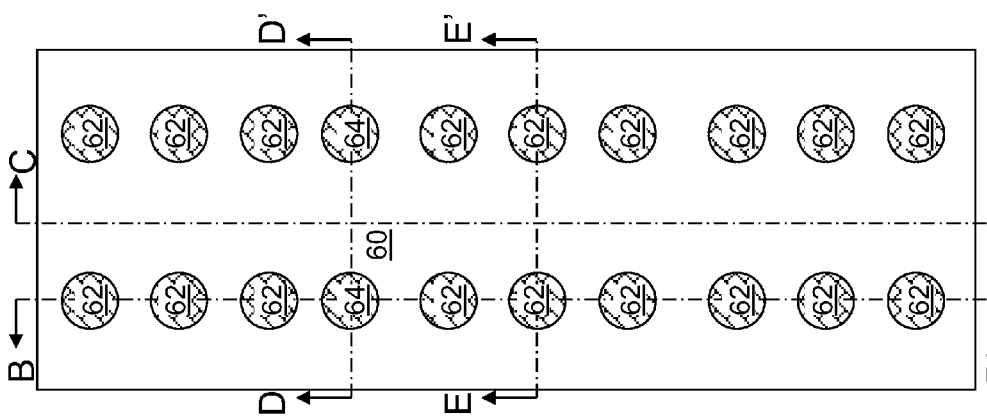
FIG. 10B
FIG. 10C
FIG. 10A

DUAL-DEPTH SELF-ALIGNED ISOLATION STRUCTURE FOR A BACK GATE ELECTRODE

BACKGROUND

The present disclosure generally relates to a semiconductor structure, and particularly to a semiconductor structure having dual isolation structures and a doped semiconductor back gate region self-aligned to at least one overlying active area, and methods of manufacturing the same.

Back gate biasing is a useful method for adaptive power management. Planar fully depleted semiconductor-on-insulator (SOI) devices with a thin buried oxide layer (BOX) can be employed to introduce a back gate bias voltage that can independently control device performance without requiring changes to settings at other device nodes. For back gate biasing to be area-efficient, i.e., to provide a back gate biasing scheme that does not require an excessive device area, a group of transistors having the same polarity and target threshold voltage should share a single back gate electrode. However, each back gate electrode should be electrically isolated from adjacent transistors or any back gate electrodes thereof, which require different bias voltages.

Conventional schemes that employ back gate electrodes do not provide self-alignment between a back gate electrode and active areas thereabove because the back gate electrode is patterned separately from the active areas. Other schemes contemplate formation of shallow trenches to an excessive depth that is not practical to implement for advanced semiconductor devices having small dimensions. A back gate device having an area-efficient design and an integration scheme to manufacture such a back gate device are thus desired.

BRIEF SUMMARY

Doped semiconductor back gate regions self-aligned to active regions are formed by first patterning a top semiconductor layer and a buried insulator layer to form stacks of a buried insulator portion and a semiconductor portion. Oxygen is implanted into an underlying semiconductor layer at an angle so that oxygen-implanted regions are formed in areas that are not shaded by the stack or masking structures thereupon. The oxygen implanted portions are converted into deep trench isolation structures that are self-aligned to sidewalls of the active regions, which are the semiconductor portions in the stacks. Dopant ions are implanted into the portions of the underlying semiconductor layer between the deep trench isolation structures to form doped semiconductor back gate regions. A shallow trench isolation structure is formed on the deep trench isolation structures and between the stacks.

According to an aspect of the present disclosure, a semiconductor structure includes: at least one stack of a buried insulator portion and a semiconductor portion located in a substrate; a shallow trench isolation structure laterally surrounding each of the at least one stack; a doped semiconductor back gate region located underneath the at least one stack; and a deep trench isolation structure laterally contacting a sidewall of the doped semiconductor back gate region, wherein at least one pair of parallel sidewalls of the at least one stack is vertically coincident with a pair of parallel sidewalls of the doped semiconductor back gate region.

According to another aspect of the present disclosure, a method of forming a semiconductor structure includes: forming a plurality of stacks on an underlying semiconductor layer, each of the plurality of stacks including at least a hard mask portion, a semiconductor portion, and a buried insulator portion; forming oxygen-implanted regions in the underlying semiconductor layer by implanting oxygen at an angle into the underlying semiconductor layer; converting the oxygen-implanted regions into deep trench isolation structures including a semiconductor oxide; and implanting dopants through the plurality of stacks into upper portions of the underlying semiconductor layer. A doped semiconductor back gate region underlying at least one of the plurality of stacks and having a pair of parallel sidewalls that contact the deep trench isolation structures is formed. At least one pair of parallel sidewalls of the plurality of stacks is vertically coincident with the pair of parallel sidewalls of the doped semiconductor back gate region.

BRIEF DESCRIPTION OF THE SEVERAL VIEWS OF THE DRAWINGS

Throughout the drawings, figures labeled with the same figure numeral correspond to the same processing step. Figures labeled with a suffix "A" are top-down views. Figures with a suffix "B," "C," "D," or "E" are vertical cross-sectional views along the plane B-B', C-C', D-D', or E-E' of the figure with the same figure numeral and the suffix, A."

FIGS. 1A and 1B are various views of a first exemplary semiconductor structure after formation of a hard mask layer on a semiconductor-on-insulator substrate according to a first embodiment of the present disclosure.

FIGS. 2A-2C are various views of the first exemplary semiconductor structure after formation of stacks of a buried insulator portion, a semiconductor portion, a hard mask portion, and a photoresist portion according to the first embodiment of the present disclosure.

FIGS. 3A-3E are various views of the first exemplary semiconductor structure after angled ion implantation of oxygen according to the first embodiment of the present disclosure.

FIGS. 4A-4E are various views of the first exemplary semiconductor structure after conversion of oxygen-implanted regions into deep trench isolation structures including a semiconductor oxide according to the first embodiment of the present disclosure.

FIGS. 5A-5E are various views of the first exemplary semiconductor structure after formation of a shallow trench isolation structure according to the first embodiment of the present disclosure.

FIGS. 6A-6E are various views of the first exemplary semiconductor structure after removal of hard mask portions and recessing of the shallow trench isolation structure according to the first embodiment of the present disclosure.

FIGS. 7A-7E are various views of the first exemplary semiconductor structure after formation of doped semiconductor back gate regions by implantation of dopant ions according to the first embodiment of the present disclosure.

FIGS. 8A-8E are various views of the first exemplary semiconductor structure after formation of semiconductor devices on the semiconductor portions according to the first embodiment of the present disclosure.

FIGS. 9A and 9B are various views of a second exemplary semiconductor structure after formation of a hard mask layer on a dual buried insulator substrate according to a second embodiment of the present disclosure.

FIG. 10A-10E are various views of the second exemplary semiconductor structure after formation of semiconductor devices on the semiconductor portions according to the second embodiment of the present disclosure.

DETAILED DESCRIPTION

Figure 3E:
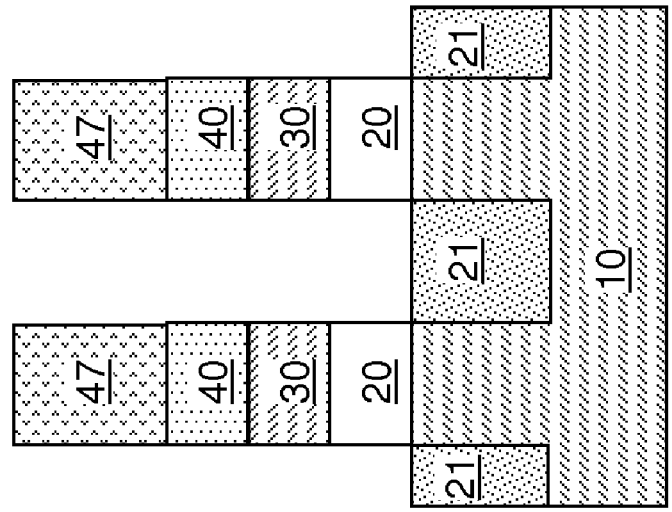

As stated above, the present disclosure relates to a semiconductor structure having dual isolation structures and a doped semiconductor back gate region self-aligned to at least one overlying active area, and methods of manufacturing the same, which are now described in detail with accompanying figures. It is noted that like reference numerals refer to like elements across different embodiments. The drawings are not necessarily drawn to scale.

Referring to FIGS. 1A and 1B, a first exemplary semiconductor structure according to a first embodiment of the present disclosure includes a semiconductor-on-insulator (SOI) substrate 8. The SOI substrate 8 includes a stack of an underlying semiconductor layer 10, a buried insulator layer 20L, and a top semiconductor layer 30L. The underlying semiconductor layer 10 functions as a handle substrate, i.e., a substrate that provides mechanical support during handling of the SOI substrate 8. The underlying semiconductor layer 10 includes a semiconductor material, which can be silicon, germanium, a silicon-germanium alloy, a silicon-carbon alloy, a silicon-germanium-carbon alloy, a III-V compound semiconductor material, a II-VI semiconductor material, or any other semiconductor material known in the art. In one embodiment, the semiconductor material of the underlying semiconductor layer 10 can be single crystalline silicon or polycrystalline silicon.

Figure 7E:
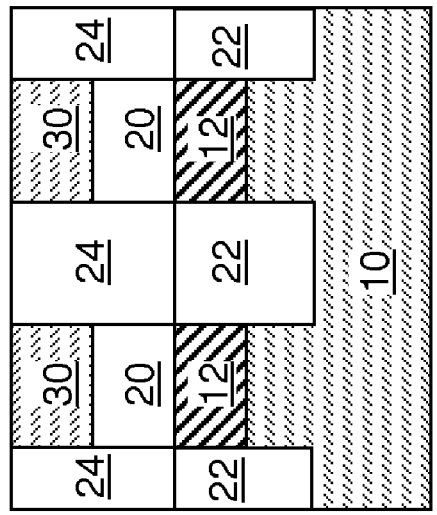
Figure 7D:
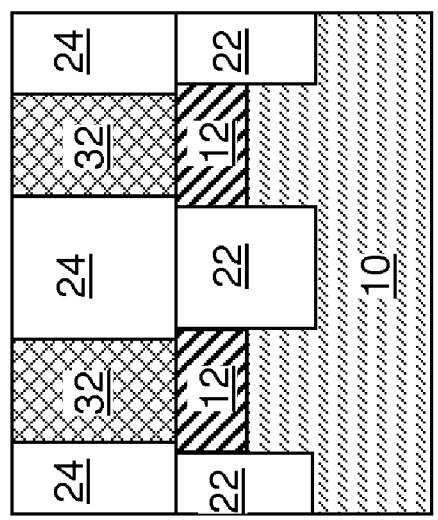

The underlying semiconductor layer 10 can include an intrinsic semiconductor material. Alternately, the underlying semiconductor layer 10 can be doped with dopants, which can be p-type dopants such as B, Ga, and In, or can be n-type dopants such as P, As, and Sb. Doped semiconductor back gate regions having a doping of a first conductivity type is formed in upper portions of the underlying semiconductor layer in subsequent processing steps. See FIGS. 7A-7E. If the underlying semiconductor layer 10 is doped, the type of doping of the underlying semiconductor layer is herein referred to a second conductivity type, which is the opposite type of the first conductivity type. The dopant concentration of the underlying semiconductor layer 10 as provided can be from $1.0\times10^{14}/cm^3$ to $1.0\times10^{19}/cm^3$, and typically from $1.0\times10^{15}/cm^3$ to $1.0\times10^{18}/cm^3$, although lesser and greater dopant concentrations can also be employed.

The buried insulator layer 20L includes a dielectric material such as silicon oxide, silicon nitride, silicon oxynitride, sapphire (aluminum oxide), or a combination thereof. The thickness of the buried insulator layer 20L can be from 10 nm to 200 nm, although lesser and greater thicknesses can also be employed.

The top semiconductor layer 30L includes a semiconductor material, which can be silicon, germanium, a silicon-germanium alloy, a silicon-carbon alloy, a silicon-germanium-carbon alloy, a III-V compound semiconductor material, a II-VI semiconductor material, or any other semiconductor material known in the art. In one embodiment, the semiconductor material of the top semiconductor layer 10 can be single crystalline silicon or single crystalline silicon-germanium alloy. The thickness of the top semiconductor layer 30L can be from 2 nm to 200 nm, and typically from 4 nm to 20 nm, although lesser and greater thicknesses can also be employed. The top semiconductor layer 30L has a planar horizontal surface, which is the topmost surface of the SOI substrate 8.

A hard mask layer 40L is deposited on the top surface of the top semiconductor layer 30L. The hard mask layer 40L includes a dielectric material such as silicon nitride. The hard mask layer 40L can be deposited, for example, by low pressure chemical vapor deposition (LPCVD) or plasma enhanced chemical vapor deposition (PECVD). The thickness of the hard mask layer 40L can be from 50 nm to 300 nm, and typically from 50 nm to 200 nm, although lesser and greater thicknesses can also be employed.

Referring to FIGS. 2A-2C, a photoresist 47L is applied to the top surface of the hard mask layer 40L, and is lithographically patterned by lithographic exposure and development. The thickness of the photoresist 47L can be from 50 nm to 1,000 nm, although lesser and greater thicknesses can also be employed. The pattern in the photoresist 47L after lithographic patterning includes shapes for multiple active areas that have parallel edges along at least one direction. For example, the shapes for the multiple active areas may be arranged in a row so that the straight edges of each shape along one direction are located within one of the two lines that define the width of the row. In other words, the multiple active areas may have the same width in the direction perpendicular to a direction, which is herein referred to as a lengthwise direction, and the lengthwise edges of the multiple active areas may be aligned in two straight lines separated by the width of the row. In FIG. 2A, the lengthwise direction is a horizontal direction in the plane of B-B' or in the plane of C-C'. Adjacent pairs of multiple active areas can be spaced along the lengthwise direction so that devices can be built with lateral electrical isolation across adjacent pairs of active areas. The width of each row, i.e., the width of the multiple active areas located within each row, can be the same or different as needed. In one embodiment, the width of each row is a lithographic dimension, and can be a minimum lithographic dimension, which is also referred to as a critical dimension.

The pattern in the photoresist 47L is transferred through the stack of the hard mask layer 40L, the top semiconductor layer 30L, and the buried insulator layer 20L by an anisotropic etch. The anisotropic etch employs the patterned photoresist 47L as an etch mask, and stops on the underlying semiconductor layer 10. The remaining portions of the photoresist 47L, the hard mask layer 40L, the top semiconductor layer 30L, and the buried insulator layer 20L form a plurality of stacks, each of which includes, from bottom to top, a buried insulator portion 20, a semiconductor portion 30, a hard mask portion 40, and a photoresist portion 47. Each buried insulator portion 20 is a remaining portion of the buried insulator layer 20L, each semiconductor portion 30 is a remaining portion of the top semiconductor layer 30L, each hard mask portion 40 is a remaining portion of the hard mask layer 40L, and each of the photoresist portion 47 is a remaining portion of the patterned photoresist 47L. All of the photoresist portions 47L collectively constitute the patterned photoresist 47L. Each semiconductor portion 30 is an active area for subsequently forming semiconductor devices thereupon.

Each stack (20, 30, 40, 47) has, upon formation, a plurality of vertical sidewalls that are within a set of parallel vertical planes along the lengthwise direction of the pattern in the patterned photoresist 47L. For each semiconductor portion 30 having a width in a direction perpendicular to the lengthwise direction, a pair of vertical planes extending along the lengthwise direction and in the vertical direction and separated by the width of the semiconductor portion 30 coincide with a pair of vertical sidewalls of the semiconductor portion 30.

Figure 3D:
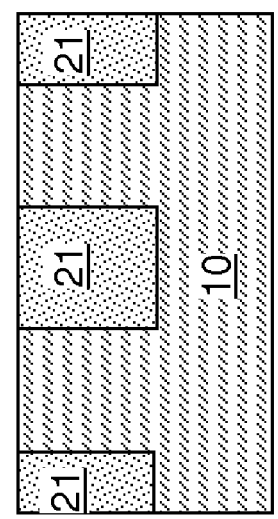

Referring to FIGS. 3A-3E, angled ion implantation is performed to implant oxygen into upper portions of the underlying semiconductor layer 10 that are not shadowed by the plurality of stacks (20, 30, 40, 47). Optionally, the patterned photoresist 47L may be removed prior to the angled ion implantation of oxygen. In one embodiment, the direction of the angled ion implantation is selected such that the direction of the oxygen ions or ionized oxygen molecules is within a plane that is parallel to the plurality of vertical planes along the lengthwise direction of the pattern in the patterned photoresist. In other words, the direction of the angled ion implantation can be within the plane B-B' or C-C' in FIG. 3A. Further, the direction of the angled ion implantation can be selected such that a vector representing the direction of the angle ion implantation, i.e., the direction of movement of the oxygen ions or ionized oxygen molecules, is offset from the surface normal to the top surface of the SOI substrate 8 by an angle from 15 degrees to 60 degrees, and typically from 30 degrees to 45 degrees. A single direction can be selected for the ion implantation of oxygen, or a pair of directions that are symmetrical around the surface normal to the SOI substrate 8 can be selected, i.e., the oxygen ions or ionized oxygen molecules can be implanted from the right side and from the left side in FIGS. 3B and 3C.

Oxygen-implanted regions 21 are formed by angled ion implantation into exposed surfaces of the underlying semiconductor layer 10 that are not shadowed by the plurality of stacks (20, 30, 40, 47). If the spacing between adjacent stacks (20, 30 40, 47) within the same row is less than the tangent of the angle (as measured from a vertical line) multiplied by the height of the plurality of stacks (20, 30, 40, 47), the exposed area of the underlying semiconductor layer 20 between the pair of adjacent stacks (20, 30, 40, 47) can be shielded from the angled ion implantation by one of the pair of adjacent stacks (20, 30, 40, 47). In such cases, portions of the exposed surfaces of the underlying semiconductor layer 10 that are located between an adjacent pair among the plurality of stacks (20, 30, 40, 47) are shadowed by the plurality of stacks (20, 30, 40, 47) during the implanting of the dopants. The oxygen-implanted regions 21 can be limited to areas between adjacent rows of the plurality of stacks (20, 30, 40, 47). Thus, the oxygen-implanted regions 21, which are the implanted areas of the underlying semiconductor layer 10, can be limited to strips that run along the lengthwise direction and have a constant width throughout, and an adjacent pair of the oxygen-implanted regions 21 can be separated in the widthwise direction by the width of a row of stacks (20, 30, 40, 47) therebetween as seen in a top-down view.

In one embodiment, the dose of the oxygen implantation can be selected so that the ratio of oxygen atoms to semiconductor atoms in the oxygen-implanted regions 21 is insufficient to form a stoichiometric semiconductor oxide. For example, the underlying semiconductor layer 10 can include single crystalline silicon, and the ratio of oxygen atoms to silicon atoms in the oxygen-implanted regions 21 can be less than 2.0, i.e., not high enough to form a stoichiometric silicon oxide ($SiO_2$). Typical dose for oxygen implantation for the formation of the oxygen-implanted region 21 can be lower than dose required to form a conventional silicon implantation oxidation (SIMOX) process, which requires sufficient dose of oxygen to form a stoichiometric silicon oxide. The dose of the oxygen implantation depends on the oxygen implantation energy (which depends on the depth of the oxygen-implanted regions 21 to be formed), and can be from $1.0 \times 10^{16}/cm^2$ to $1.0 \times 10^{18}/cm^2$, although lesser and greater oxygen doses can also be employed. The thickness of the oxygen-implanted regions 21 can be from 60 nm to 300 nm, although lesser and greater thicknesses can also be employed. The width of each oxygen-implanted region 21 can be from 30 nm to 2,000 nm depending on the design of the first semiconductor structure, and is typically from 30 nm to 200 nm, although lesser and greater widths can also be employed. The photoresist layer 47L is subsequently removed, for example, by ashing.

Figure 4E:
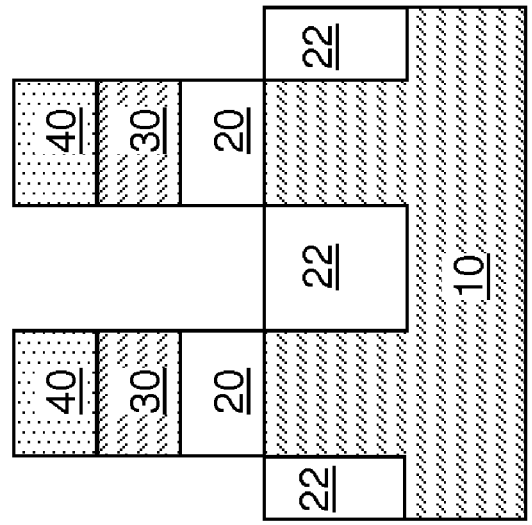
Figure 4D:
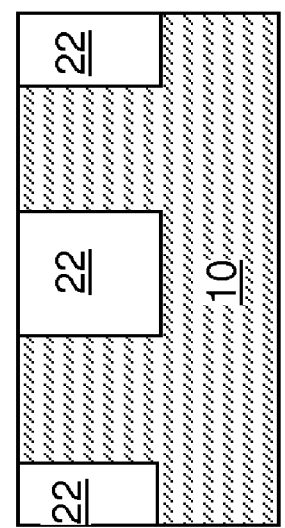

Referring to FIGS. 4A-4E, the first exemplary semiconductor structure is annealed at an elevated temperature to convert the oxygen-implanted regions 21 into deep trench isolation structures 22. The deep trench isolation structures 22 include a semiconductor oxide of the semiconductor material of the underlying semiconductor layer 10. If the ratio of oxygen atoms to semiconductor atoms in the oxygen-implanted regions 21 is insufficient to form a stoichiometric semiconductor oxide, a non-stoichiometric semiconductor-rich oxide can be provided in the deep trench isolation structures 22. For example, if the ratio of oxygen atoms to silicon atoms in the oxygen-implanted regions 21 is less than 2.0, i.e., a non-stoichiometric silicon rich oxide having a composition of $SiO_x$ in which x is in a range from 1.3 to 1.9 can be formed. The thickness of the deep trench isolation structures 22 can be from 60 nm to 300 nm, although lesser and greater thicknesses can also be employed. The width of each oxygen-implanted region 21 can be from 30 nm to 2,000 nm depending on the design of the first semiconductor structure, and is typically from 30 nm to 200 nm, although lesser and greater widths can also be employed.

At this step, each deep trench isolation structure 22 laterally contacts sidewalls of the underlying semiconductor layer 10. For each deep trench isolation structure 22, the parallel sidewalls along the lengthwise direction of the stack (20, 30, 40) are vertically coincident with parallel sidewalls of the deep trench isolation structure 22. The lengthwise sidewalls of the deep trench isolation structures 22, the buried insulator portions, the semiconductor portion 30, the hard mask portions 40 are vertically coincident, and are within the same set of parallel vertical planes.

Figure 5E:
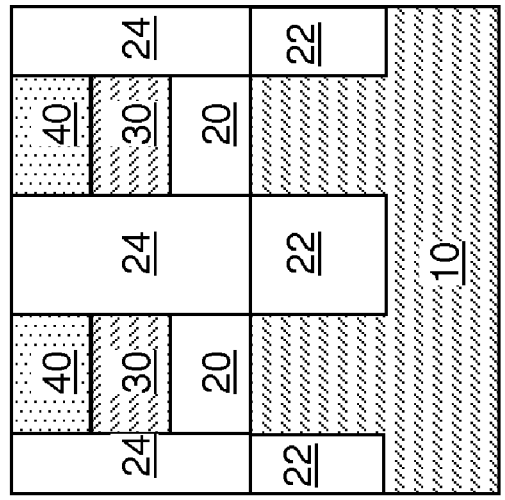
Figure 5D:
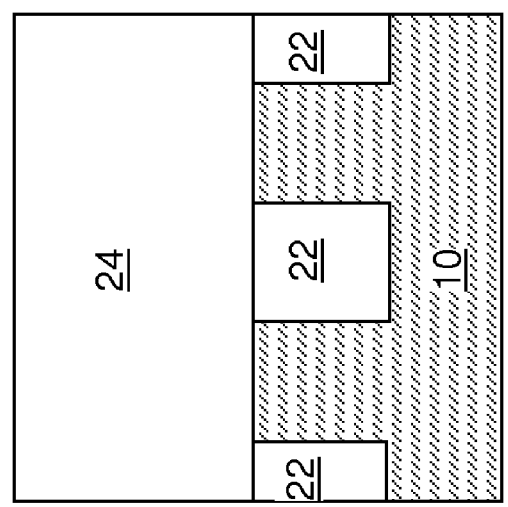

Referring to FIGS. 5A-5E, a dielectric material such as silicon oxide, silicon nitride, silicon oxynitride, or a combination thereof is deposited in the space between adjacent stacks (20, 30, 40). The dielectric material is subsequently planarized employing the hard mask portions 40 as a stopping layer. The planarization can be effected, for example, by chemical mechanical planarization (CMP), recess etch, or a combination thereof. The remaining portion of the dielectric material forms a shallow trench isolation structure 24, which contiguously covers and contacts all top surfaces of the deep trench isolation structures 22 and the top surfaces of the underlying semiconductor layer 10. The shallow trench isolation structure 24 can have a top surface that is coplanar with the top surfaces of the stacks (20, 30, 40), i.e., top surfaces of the hard mask portions 40.

The shallow trench isolation structure 24 laterally surrounds each of the plurality of stacks (20, 30, 40). All sidewalls of the semiconductor portions 30 laterally contact the shallow trench isolation structure 24. The shallow trench isolation structure 24 can include a dielectric material that is different from the material of the deep trench isolation structures 22, i.e., the shallow trench isolation structure 24 and the deep trench isolation structures have different material compositions. For example, the shallow trench isolation structure 24 can include a stoichiometric silicon oxide, i.e., $SiO_2$, and the deep trench isolation structures 22 can include a non-stoichiometric silicon oxide or an oxide of a semiconductor material other than silicon oxide (e.g., stoichiometric or non-stoichiometric germanium oxide or a stoichiometric or non-stoichiometric germanium-silicon oxide). Alternately, the shallow trench isolation structure 24 can include silicon nitride or silicon oxynitride, and the deep trench isolation structures 22 can include an oxide of a semiconductor material such as silicon oxide.

Figure 6E:
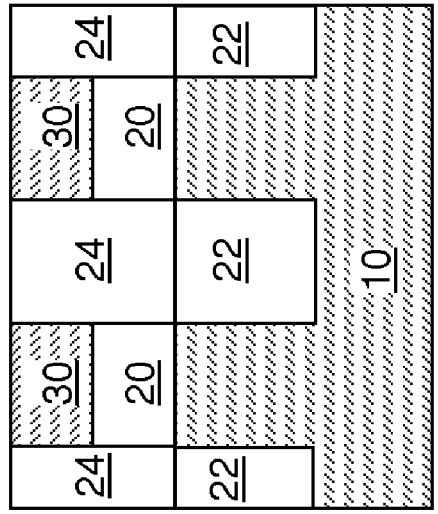
Figure 6D:
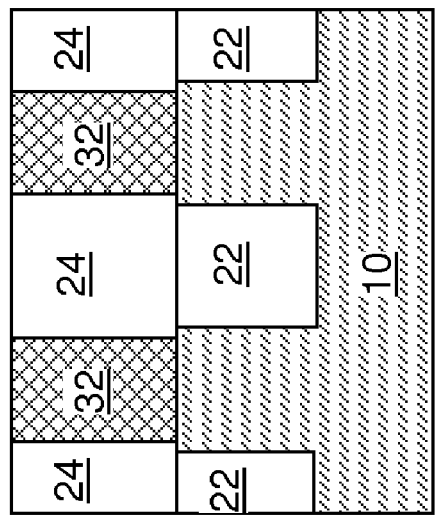

Referring to FIGS. 6A-6E, hard mask portions 40 are removed selectively or non-selectively to the shallow trench isolation structure 24. The shallow trench isolation structure 24 is vertically recessed so that the top surface of the shallow trench isolation structure 24 after recessing is coplanar with the top surfaces of the semiconductor portions 30. Alternately, the recessed top surfaces of the shallow trench isolation structure can be vertically offset by a desired step height from the top surfaces of the semiconductor portions 30. A range for the vertical offset can be from −30 nm to +30 nm, and typically from −15 nm to +15 nm, although lesser and greater vertical offsets can also be employed.

The recessing of the top surface of the shallow trench isolation structure 24 can be performed during the removal of the hard mask portions 40 or in a separate processing step depending on whether the composition of the shallow trench isolation structure is the same as, or different from, the composition of the hard mask portions 40.

Back gate contact structures 32 can be formed through the shallow trench isolation structure 24, for example, by forming via holes through the shallow trench isolation structure 24 and filling the via holes with a conductive material. Excess conductive material above the shallow trench isolation structure 24 is removed, for example, by planarization, a recess etch, or a combination thereof. The conductive material can be a doped semiconductor material, or can be a metallic material. Each back gate contact structure 32 extends from a top surface of the SOI substrate 8, i.e., the surface that is coplanar with top surfaces of the semiconductor portions 30, to the underlying semiconductor layer 10.

Referring to FIGS. 7A-7E, p-type dopant ions or n-type dopant ions are implanted through the stacks (20, 30) into upper portions of the underlying semiconductor layer 10 to form doped semiconductor back gate regions 12. The implantation of the dopant ions can be performed along the direction of the surface normal of the top surface of the underlying semiconductor layer 10. However, angled ion implantation is also possible provided that the deviation from the surface normal is not excessive, i.e., less than 30 degrees.

The type of dopants implanted into the doped semiconductor back gate regions 12 is herein referred to as a first conductivity type. If the underlying semiconductor layer 10 as originally provided includes a doped semiconductor material, the dopant type of the dopants originally present in the underlying semiconductor layer 10 is the opposite of the dopant type of the dopants implanted into the doped semiconductor back gate regions 12, and is herein referred to as the second conductivity type. The second conductivity type is the opposite of the first conductivity type. Further, the concentration of the implanted first-conductivity-type dopants in the doped semiconductor back gate region 12 exceeds the concentration of any second-conductivity-type dopant originally provided in the underlying semiconductor layer 10.

Thus, the doped semiconductor back gate regions 12 after the ion implantation of the first-conductivity-type dopants has a net doping of the first conductivity type. The net dopant concentration, i.e., the difference between the dopant concentration of the first-conductivity-type dopants and the dopant concentration of the second-conductivity-type, can be from $1.0 \times 10^{18}/cm^3$ to $1.0 \times 10^{21}/cm^3$, although lesser and greater net dopant concentrations can also be employed. Thus, a p-n junction is formed at each interface between a doped semiconductor back gate region 32 and the underlying semiconductor layer 10 if the underlying semiconductor layer 10 is doped. If the underlying semiconductor layer 10 is intrinsic, a p-i junction or a n-i junction can be formed at the interface between the doped semiconductor back gate regions 12 and the underlying semiconductor layer 10.

Each doped semiconductor back gate region 12 underlies at least one of stack (20, 30) and can underlie multiple stacks (20, 30) within the same row, i.e., multiple stacks (20, 30) along the lengthwise direction. If a plurality of stacks (20, 30) is present within the same row, a doped semiconductor back gate region 12 can underlie the plurality of stacks (20, 30). In this case, the doped semiconductor back gate region 12 contiguously extends underneath the plurality of stacks (20, 30).

Each doped semiconductor back gate region 12 has a pair of parallel sidewalls in lengthwise vertical planes. The parallel sidewalls of the stacks (20, 30) along the lengthwise direction are vertically coincident with the parallel sidewalls of the doped semiconductor back gate regions 12.

The thickness of the doped semiconductor back gate regions 12 is less than the thickness of the deep trench isolation structures 22. Thus, the deep trench isolation structures 22 extend to a depth greater than the depth of the bottom surfaces of the doped semiconductor back gate regions 12. The thickness of the doped semiconductor back gate regions 12 can be from 20 nm to 150 nm, although lesser and greater thicknesses can also be employed.

If a plurality of stacks (20, 30) are present above a doped semiconductor back gate region 12 and located in a row between two adjacent deep trench isolation structures 22, each of the plurality of lengthwise parallel sidewalls of the plurality of stacks (20, 30) overlying that doped semiconductor back gate region 12 can be vertically coincident with the pair of lengthwise parallel sidewalls of the doped semiconductor back gate region 12, i.e., the pair of vertical parallel sidewalls along the lengthwise direction.

Each deep trench isolation structure 22 laterally contacts sidewalls of at least one doped semiconductor back gate region 12, and can contact sidewalls of two doped semiconductor back gate regions 12. A semiconductor back gate region 12 laterally contacts two deep trench isolation structures 22. The lateral spacing between the two deep trench isolation structures 22 is equal to the width of the semiconductor back gate region 12 therebetween, and is equal to the width of the stacks (20, 30) above that semiconductor back gate region 12.

The shallow trench isolation structure 24 contiguously covers and contacts all top surfaces of the deep trench isolation structures 22 and the top surfaces of the doped semiconductor back gate regions 12 between adjacent pairs of stacks buried insulator portions 20 within the same row. Each back gate contact structure 32 extends from a top surface of the SOI substrate 8 to a doped semiconductor back gate region 12.

Figure 8E:
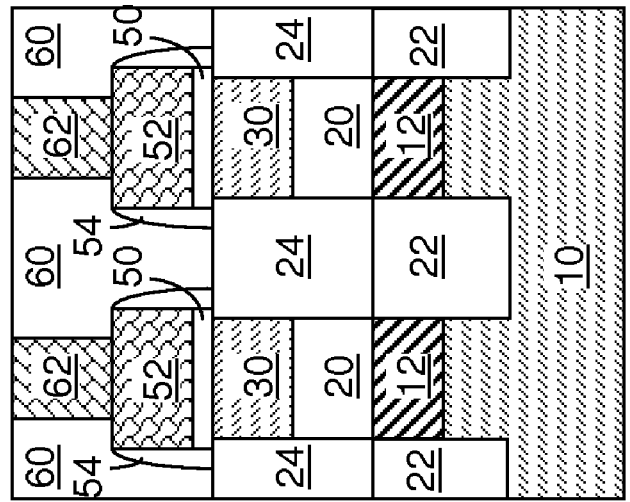
Figure 8D:
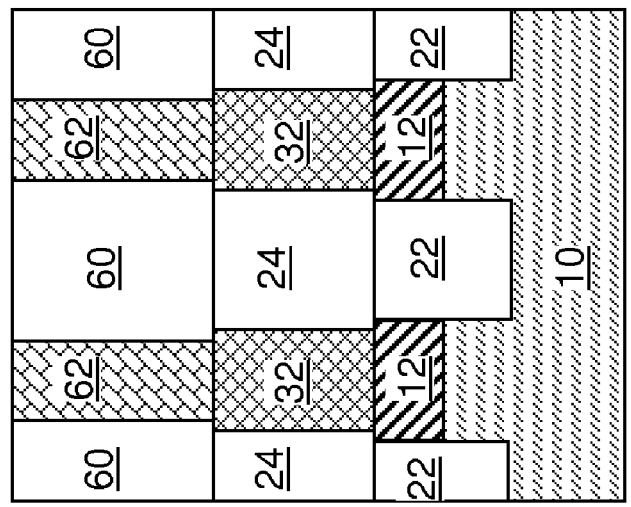

Referring to FIGS. 8A-8E, various semiconductor devices such as field effect transistors can be formed on the semiconductor portions 30 employing the semiconductor portions 30 as active areas. For example, source and drain regions 36 and body regions 34 can be formed in the semiconductor portions 30. Gate dielectrics 50, gate conductors 52, and gate spacers 54 can be formed over the semiconductor portions 30. A contact level dielectric layer 60 can be deposited, and contact via structures (62, 64) can be formed in the contact level dielectric layer 60, for example, by forming via holes and filing the via holes with a conductive material such as a metallic material. Other semiconductor devices known in the art can also be formed.

Referring to FIGS. 9A and 9B, a second exemplary semiconductor structure according to a second embodiment of the present disclosure employs a dual buried insulator substrate 8', which includes a stack, from bottom to top, of a handle substrate 102, a bottom buried insulator layer 104, a middle semiconductor layer 110, a top buried insulator layer 120L, and a top semiconductor layer 30L. The handle substrate 102 can include a semiconductor material, an insulator material, a conductor material, or a combination thereof. The bottom buried insulator layer 104 is a contiguous buried insulator layer, and includes a dielectric material. The dielectric material of the bottom buried insulator layer 104 can be any of the material that can be employed for the buried insulator layer 20L of the first embodiment. The middle semiconductor layer 110 includes a semiconductor material, which can be any material that can be employed for the underlying semiconductor layer 10 of the first embodiment. The top buried insulator layer 120L can include the same material as, and can have the same thickness as, the buried insulator layer 20L of the first exemplary structure of the first embodiment.

The processing steps of the first embodiment can be employed for the second embodiment. Due to the presence of the bottom buried insulator layer 104, the deep trench isolation structures 22 can extend to, and contact, the top surfaces of the bottom buried insulator layer 104, which can have a different composition than the deep trench isolation structures 22.

Figure 10E:
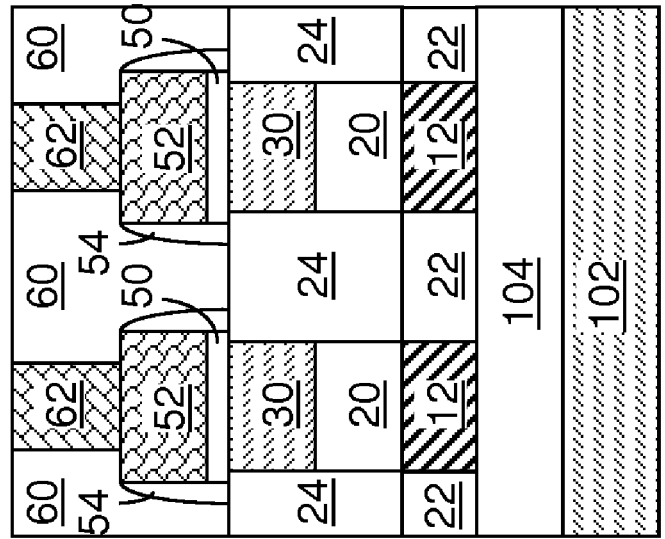
Figure 10D:
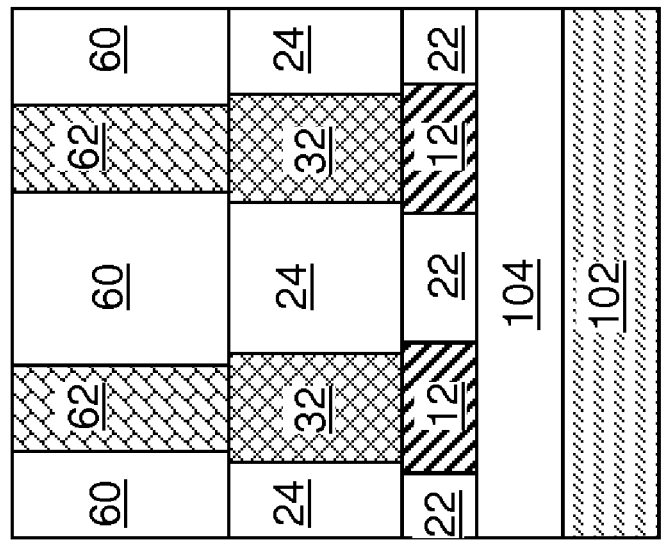

Referring to FIGS. 10A-10E, after the processing steps of the first embodiment, deep trench isolation structures 22 and doped semiconductor back gate regions 12 are formed between the horizontal plane of the bottom surface of the buried insulator portions 20 and the top surface of the bottom buried insulator layer 104. Portions of the middle semiconductor layer 110 are implanted with oxygen and annealed to form the deep trench isolation structures 22. The remainder of the middle semiconductor layer 110 is implanted with p-type dopants or n-type dopants to form doped semiconductor back gate regions 12. The deep trench isolation structures 22 and the doped semiconductor back gate regions 12 complementarily fill the volume between the horizontal plane of the bottom surface of the buried insulator portions 20 and the top surface of the bottom buried insulator layer 104. The deep trench isolation structures 22 extend to, and contact, the top surfaces of the bottom buried insulator layer 104. Thus, each doped semiconductor back gate region 12 can be encapsulated by buried insulator portions 20, deep trench isolation structures 22, the bottom buried insulator layer 104, and (a) back gate contact structure(s) 32. The encapsulation of the doped semiconductor back gate regions 12 by dielectric materials and the back gate contact structures 32 can provides electrical isolation to each doped semiconductor back gate region 12.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A semiconductor structure comprising:
at least one stack of a buried insulator portion and a semiconductor portion located in a substrate;
a shallow trench isolation structure laterally surrounding each of said at least one stack;
a doped semiconductor back gate region located underneath said at least one stack; and
a deep trench isolation structure laterally contacting a sidewall of said doped semiconductor back gate region, wherein at least one pair of parallel sidewalls of said at least one stack is vertically coincident with a pair of parallel sidewalls of said doped semiconductor back gate region.

2. The semiconductor structure of claim 1, wherein said deep trench isolation structure comprises a silicon rich oxide having a composition of $SiO_x$, wherein x is in a range from 1.3 to 1.9.

3. The semiconductor structure of claim 1, wherein said shallow trench isolation structure and said deep trench isolation structure have different material compositions.

4. The semiconductor structure of claim 1, wherein all sidewalls of said at least semiconductor portion laterally contact said shallow trench isolation structure.

5. The semiconductor structure of claim 1, wherein bottom surfaces of said shallow trench isolation structure contact a top surface of said deep trench isolation structure and a top surface of said doped semiconductor back gate region.

6. The semiconductor structure of claim 1, wherein said at least one stack is a plurality of stacks, said at least one pair of parallel sidewalls of said at least one stack is a plurality of parallel sidewalls of said plurality of stacks, and each of said plurality of parallel sidewalls of said plurality of stacks is vertically coincident with said pair of parallel sidewalls of said doped semiconductor back gate region.

7. The semiconductor structure of claim 6, wherein said doped semiconductor back gate region contiguously extends underneath each of said plurality of stacks.

8. The semiconductor structure of claim 1, further comprising a back gate contact structure extending from a surface of said substrate that is coplanar with a top surface of said semiconductor portion to said doped semiconductor back gate region.

9. The semiconductor structure of claim 1, further comprising another deep trench isolation structure laterally contacting another sidewall of said doped semiconductor back gate region and laterally spaced from said deep trench isolation structure by a same width along a lengthwise direction of said deep trench isolation structure.

10. The semiconductor structure of claim 1, wherein a bottom surface of said deep trench isolation structure extends from a top surface of said substrate to a depth greater than a depth of a bottom surface of said doped semiconductor back gate region.

11. The semiconductor structure of claim 1, further comprising a contiguous buried insulator layer located within said substrate and underneath said doped semiconductor back gate region and said deep trench isolation structure and contacting a bottom surface of said deep trench isolation structure.

* * * * *